United States Patent [19]

Dobkin

[11] 4,378,529
[45] Mar. 29, 1983

[54] DIFFERENTIAL AMPLIFIER INPUT STAGE CAPABLE OF OPERATING IN EXCESS OF POWER SUPPLY VOLTAGE

[75] Inventor: Robert C. Dobkin, Hillsborough, Calif.

[73] Assignee: National Semiconductor Corporation, Santa Clara, Calif.

[21] Appl. No.: 300,358

[22] Filed: Sep. 8, 1981

Related U.S. Application Data

[63] Continuation of Ser. No. 28,158, Apr. 9, 1979, abandoned.

[51] Int. Cl.³ .............................................. H03F 3/45
[52] U.S. Cl. ..................................... 330/257; 330/258; 330/259
[58] Field of Search ........................ 330/257, 258, 259

[56] References Cited

U.S. PATENT DOCUMENTS

| | | | |
|---|---|---|---|
| 3,786,362 | 1/1974 | Marsh et al. | 330/258 |
| 3,895,307 | 7/1975 | Furuhashi | 330/261 X |
| 3,938,055 | 2/1976 | Buhler | 330/258 |
| 4,059,808 | 11/1977 | Sakamoto et al. | 330/257 |

OTHER PUBLICATIONS

Jaeger, "High Performance Differential Amplifier Input Stage", *IBM Technical Disclosure Bulletin*, vol. 20, No. 2, Jul. 1977, pp. 812, 813.
Buhler, "Differential Amplifier", IBM Technical Disclosure Bulletin, vol. 13, No. 12, May 1971, p. 3717.

*Primary Examiner*—James B. Mullins
*Attorney, Agent, or Firm*—Gail W. Woodward; Paul J. Winters; Neil B. Schulte

[57] ABSTRACT

A pair of common base connected transistors have their emitters coupled to provide the input terminals of a differential amplifier. The collectors are coupled to a current mirror that provides a small current bias that operates the transistors at equal current densities. The common bases are coupled to a node that is driven to a level that causes the bases to track the emitters with a one $V_{BE}$ offset that will therefore automatically adjust to conform to the applied current. When a remotely grounded transducer is coupled to the amplifier input it can operate at a common mode potential outside of the span of the power supply that operates the amplifier.

4 Claims, 7 Drawing Figures

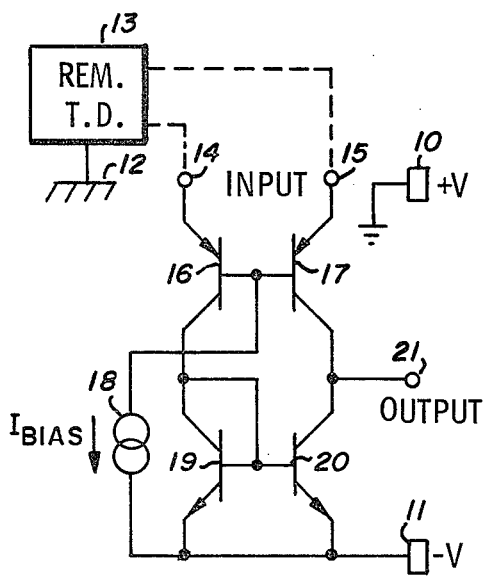
Fig_1
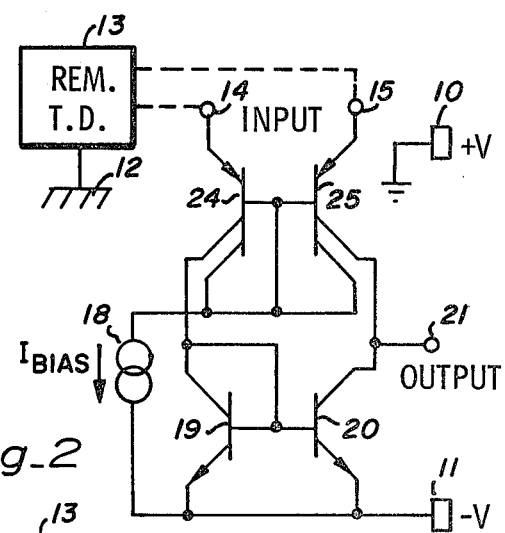
Fig_2
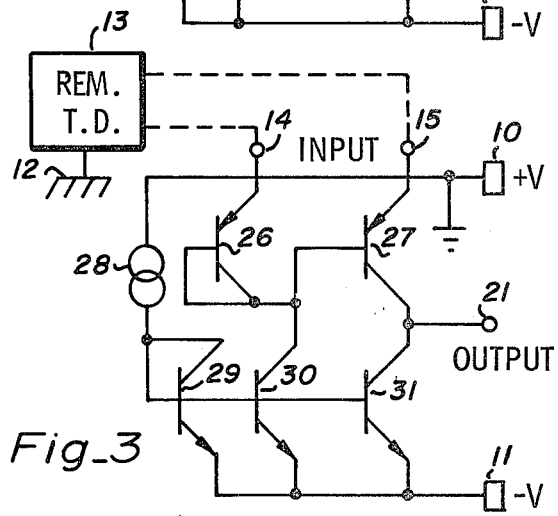
Fig_3
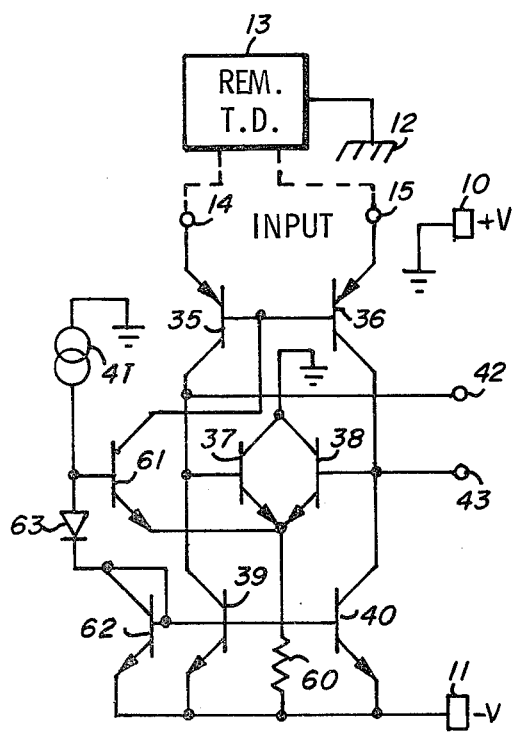
Fig_4
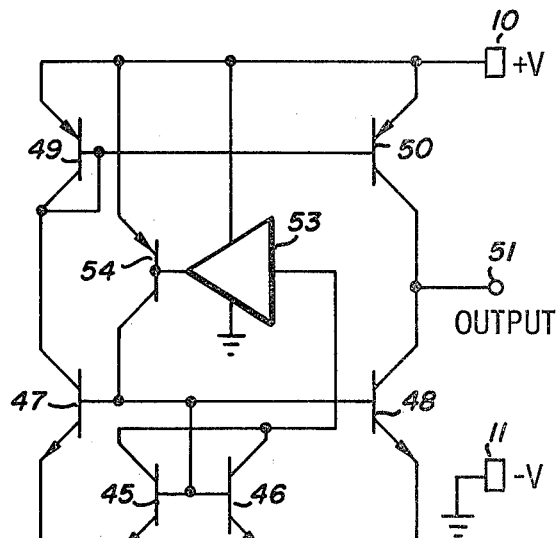
Fig_5

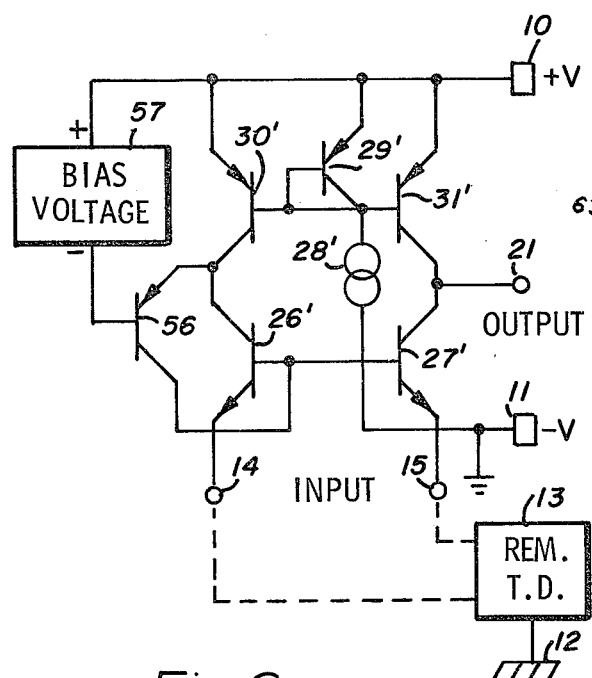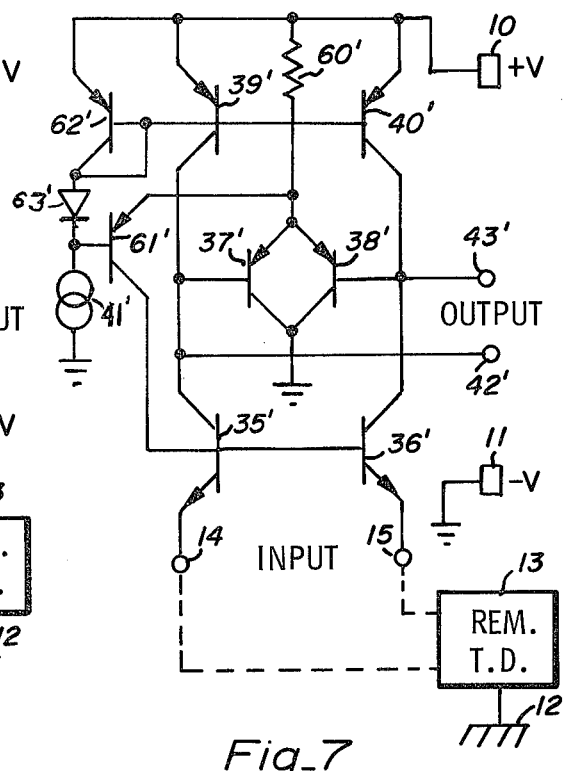
Fig_6
Fig_7

DIFFERENTIAL AMPLIFIER INPUT STAGE CAPABLE OF OPERATING IN EXCESS OF POWER SUPPLY VOLTAGE

This is a continuation of application Ser. No. 28,158, filed Apr. 9, 1979, and now abandoned.

BACKGROUND OF THE INVENTION

The invention relates generally to instrumentation amplifiers which are defined as amplifiers having a differential input, both terminals of which display high impedance, and a single ended output. Such amplifiers are typically coupled to transducers to provide signal translation that acts to develop a single ended replica of the differential transducer signal at a level and amplitude suitable for subsequent signal processing. The amplifier has a high common mode signal rejection and power supply variation rejection.

In many applications the transducer is located remotely from the amplifier in a relatively inaccessible spot and a transmission line is used to couple the transducer to the amplifier input. It is also common practice to ground the transducer at its remote location. Since the amplifier ground includes one of the power supply connections, any potential difference between the local and remote grounds appears as a common mode potential and is rejected. However, in monolithic integrated circuit (IC) amplifiers there may be a problem. In conventional IC design, the circuit chip substrate is commonly connected to the negative power supply terminal. The transistors and other circuit elements fabricated into the substrate are PN junction isolated from the substrate. The isolated components therefore have to be reverse biased with respect to the substrate in order to make the isolation effective. In the typical NPN transistor the collectors are the junction isolated elements and their base and emitter electrodes are diffused therein. In this configuration the collectors must be positively biased with respect to the substrate and the emitters are typically returned to the substrate as the most negative circuit potential. Thus, the input transistor bases must be positive with respect to the substrate. In other words, the input transistor bases must be biased at a potential that lies within the span of the power supply potential.

In the case where the input common mode is to include potentials more negative than the negative power supply potential, it is common practice to add a second negative power supply whose span embraces the negative common mode potentials. The most common configuration for monolithic IC instrumentation amplifiers is to operate them from equal positive and negative power supplies with the common point representing the circuit ground which is also the nominal transducer operating level.

In many applications it is not practical or convenient to employ a dual power supply. For example, in vehicular or automotive applications a single battery having one terminal grounded to the vehicle frame is available. It is impractical to implement a dual supply. Also in this environment, where the transducer is frame grounded at one location and the amplifier grounded at a different point, it has been found that the common mode potentials can be on the order of several volts and of either polarity. Such potentials are dependent upon many uncontrolled factors and are therefore unpredictable. In a system having a negative battery ground at the amplifier, positive transducer common mode potentials are no problem and a conventional IC can cope with them. However, for negative common mode potentials conventional IC circuit designs will be inoperative.

SUMMARY OF THE INVENTION

It is an object of the invention to provide an IC instrumentation amplifier input circuit in which common mode potentials both above and below the circuit ground will be accepted.

It is a further object of the invention to provide a differential amplifier input stage which can operate from a single power supply and which will operate on common mode potentials outside the span of the supply potentials.

These and other objects are achieved in a circuit designed to operate from a single grounded power supply and to amplify signals from a remotely grounded transducer. The input stage employs a pair of common base connected transistors connected so that the emitters comprise the circuit input terminals. Any emitter current is supplied via the transducer ground. The transistor collectors are coupled to a current mirror that acts as a collector bias current control and provides the signal output from the stage. Desirably the input transistors operate at equal current density which is achieved by matching devices and using equal collector biasing currents. Means are provided for controlling the potential at the transistor bases to track the emitter potential with a one $V_{BE}$ offset. Where the input common mode range will be more positive than the positive terminal of the single power supply, the input transistors will be of the PNP variety. Where the the input common mode range is negative with respect to the negative supply terminal, the input transistors will be of the NPN variety.

In the simplest embodiment the input stage employs low Beta transistors and the common base node is biased by means of a high resistance current path. When high Beta transistors are to be employed, means are employed for reducing their circuit Beta to a low controlled value.

BRIEF DESCRIPTION OF THE DRAWING

FIGS. 1 through 4 are schematic diagrams of input stage circuit configurations where the common mode may be positive with respect to the power supply potential span; and FIGS. 5 through 7 are schematic diagrams of input stage circuit configurations where the common mode input may be negative with respect to the power supply potential span.

DESCRIPTION OF THE INVENTION

FIG. 1 shows the basic circuit of the invention. The amplifier shown is the first stage of an instrumentation amplifier intended for use with a single power supply to be connected between terminals 10, for +V, and 11, for −V. While terminal 10 is shown as the ground connection, a remote ground 12 is associated with a transducer 13 whose output is to be amplified. Transducer 13 is shown connected by dashed lines to input terminals 14 and 15. In operation remote ground 12 provides a current path from the power supply connected at terminal 10 for the current that must flow into terminals 14 and 15 for circuit operation. Thus, while the transducer and connecting wires are external to the IC, they must be present before the circuit can function.

In many applications it is found that remote grounds such as the one shown at 12 can assume a substantial level relative to ground terminal 10. In fact the potential can be as high as several volts. In a conventional instrumentation amplifier, when the remote ground assumes a potential that is within the span of power supply, there is no problem. However, when the potential is outside the power supply span, the conventional IC amplifier may not operate. In FIG. 1 ground 12 can be positive with respect to terminal 10 and the circuit will still operate normally.

Transistors 16 and 17 are common base connected with their emitters connected to input terminals 14 and 15 respectively. A current source 18 is shown connected between the input transistor bases and terminal 11. Actually in its simplest form 18 would be a resistor having a value that is large with respect to the effective base to emitter resistance of the transistors. Thus, as the common mode potentials at terminals 14 and 15 change level, the base current in transistors 16 and 17 will cause the base potential to track. In operation the potential at the transistor bases will assume a level one $V_{BE}$ more negative than the input terminals.

Transistors 19 and 20 are connected as a current mirror load to the collectors of transistors 16 and 17 so that terminal 21 comprises the single ended output for the stage. The signal at terminal 21 will be a result of the differential input at terminals 14 and 15. Common mode signals at the input terminals 14 and 15 will result in cancellation and therefore rejection at terminal 21.

In the circuit of FIG. 1 it can be seen that if transistors 16 and 17 are high Beta devices, their base current for small input currents will be extremely low. This means that the resistor at 18 could become prohibitively large. As a practical matter transistors 16 and 17 could be low gain devices. Desirably the Beta will be in the range of 1 to 6 with a Beta of 2 preferred.

If a Beta of unity is assumed, it can be seen that the combined currents into terminals 14 and 15 will be twice the value of $I_{BIAS}$. Desirably transistors 16 and 17 will be matched so that equal currents flow in each one. For this condition the current mirror in the collectors should be made to produce equal collector currents. Matching transistor 19 to transistor 20 will produce this effect. While not shown, equal value resistors could be coupled in series with the emitters of transistors 19 and 20.

In operation $I_{BIAS}$ plus the collector currents of transistors 16 and 17 will flow into the input terminals 14 and 15. This current must be supported by transducer 13 by way of remote ground 12. This current can be made small, for example on the order of fractional microamperes, so that the input impedance looking into terminals 14 and 15 is high. It can be seen that as terminals 14 and 15 are driven more positive as a common mode input component, the base node will track and there will be very little effect on balance or collector current.

FIG. 2 represents a practical means of achieving low Beta transistor operation. Those parts that are like those of FIG. 1 have the same identifying numbers. Input transistors 24 and 25 are of the dual collector lateral design, well-known in IC construction. Each one has a collector returned to the common base connection. If the collectors are ratioed to be equal, it can be seen that the effective device Beta is unity. Furthermore, the Beta is determined almost entirely by collector ratioing and therefore not subject to variations due to temperature, current, voltage, and device processing. In the case where the two collectors have equal collection and the transistors of inherently high Beta, the current flowing in device 18 will be equal to one half of the combined currents flowing into terminals 14 and 15.

FIG. 3 shows another form of low Beta transistor amplifier stage. Input transistors 26 and 27 are common base connected and the collector of transistor 26 is directly connected to its base, thereby making its effective Beta unity. Transistors 29, 30, and 31 comprise a current mirror load. Assuming that transistor 26 matches transistor 27 and transistor 30 matches transistor 31, the current flowing in current source 28 is reflected by transistors 30 and 31 which sink equal currents out of transistors 26 and 27. Since the collector of transistor 26 is returned to the common base node, it will track at one $V_{BE}$ negative with respect to the input emitters. Any differential input at terminals 14 and 15 will appear as a signal at terminal 21.

FIG. 4 shows an improved circuit over those of FIGS. 1-3 and has the added feature of differential output capability. Here high Beta input transistors 35 and 36 are desirably matched for equal collection and common base connected. The collectors of transistors 35 and 36 are coupled to emitter follower transistors 37 and 38 respectively. Resistor 60 acts as the common emitter follower load. The emitter follower output is coupled through common base connected transistor 61 to the common base connection on input transistors 35 and 36. Thus, each device has a high gain negative feedback loop from its collector back to its base. If transistors 37 and 38 are matched, terminals 42 and 43 will be at the same quiescent voltage which is close to two $V_{BE}$'s above terminal 11. The combined base currents from transistors 35 and 36 flow in transistor 61 and resistor 60. The level of conduction is set by the value of resistor 60 which can typically be on the order of 10 kohms. Transistor 62 forms a current mirror with transistors 39 and 40 which supply the collector currents of transistors 35 and 36 respectively. Current source 41 sets these collector currents. Diode 63 is present to set the bias on the base of transistor 61 at about two $V_{BE}$ values above terminal 11. The bases of transistors 35 and 36 will track their emitters one $V_{BE}$ lower in potential and the emitters can be operated at a level more positive than terminal 10 without difficulty.

FIGS. 1 through 4 all disclose circuits in which the input terminals can be operated at potentials positive with respect to the positive power supply terminal. FIGS. 5 through 7 will disclose circuits that permit the input terminals to operate at potentials negative with respect to the negative power supply terminal.

In FIG. 5, four common base transistors 45-48 have their emitters coupled to input terminals 14 and 15 as shown. Transistors 45 and 46 are used to sense the common mode input potential while transistors 47 and 48 are used to respond to the differential input potential. Transistors 49 and 50 form a current mirror load for transistors 47 and 48 so that the output at terminal 51 is a single ended response to the differential input at terminals 14 and 15. The collectors of transistors 45 and 46 are connected together to buffer amplifier 53 which drives control transistor 54. It can be seen that transistor 54 will drive the common base input node so that it is located at one $V_{BE}$ above terminals 14 and 15. Thus, buffer 53 and transistor 54 comprises a high gain negative feedback loop from the collectors of transistors 45 and 46 back to their bases. As remote ground 12 goes negative with respect to terminal 11, the feedback loop will cause the common base node to follow one $V_{BE}$ above.

The circuits of FIGS. 6 and 7 are the complements of those of FIGS. 3 and 4 respectively. The circuits operate substantially as their complements except for the direction of current flow. However, in FIG. 6, transistor 56 provides a shunt current path from the collector of transistor 26' to its base. The base of transistor 56 is maintained at a constant potential below +V. This effectively clamps the collector of transistor 26' one diode drop above the base voltage on transistor 56. Thus while transistor 26' acts as a diode, its collector potential is prevented from being pulled below −V by the common mode voltage. Bias voltage 57 could be a typical 2.5 volt reference supply. The complemented circuits carry the same number designation with a prime sign to distinguish the complement. These circuits enable the input terminals 14 and 15 to operate substantially below the potential of ground terminal 11.

The invention has been described and several embodiments detailed. Upon reading the above disclosure a person skilled in the art will recognize that there are other alternatives and equivalents within the spirit and intent of the invention. Accordingly, it is intended that the scope of the invention be limited only by the claims that follow.

I claim:

1. A monolithic semiconductor integrated circuit differential amplifier input stage having first and second differential input terminals capable of supporting a common mode input voltage range that substantially exceeds the voltage span of a single two terminal power supply used to operate said circuit in which p n junction isolated transistors must have their collectors located in semiconductor regions that are reverse biased with respect to the semiconductor substrate that contains said circuit, said input stage comprising:

first and second terminals of a single power supply connectable to a unitary source of operating voltage;

first and second input transistors connected in a common base configuration, said first and second input transistors each having emitter, base and collector electrodes;

means for connecting said emitter electrodes of said first and second transistors respectively directly to said first and second input terminals;

means for reducing the base to collector current gain of said first and second transistors to a value close to unity;

means for coupling said bases of said first and second transistors together and to means coupled to said second power supply terminal for providing a high resistance path for base current bias; and current mirror means coupled between said collectors of said first and second transistors and said second power supply terminal to provide a collector biasing current and to obtain a signal related to the differential voltage between said first and second input terminals.

2. The input stage of claim 1 wherein said first and second transistors are inherently of high base to collector current gain and include plural collector construction and at least one collector of each of said first and second transistors is coupled to its base.

3. The input stage of claim 1 further comprising feedback means coupled between the collector and base electrodes of at least one of said first and second transistors to bias the bases of said first and second transistors to cause the voltage at said bases to track said common mode input voltage.

4. The input stage of claim 3 wherein said feedback means comprise amplifier means coupled between said bases of said first and second transistors and at least one of said collectors of said first and second transistors.

* * * * *